(12) United States Patent
Task et al.

(10) Patent No.: US 11,719,105 B2
(45) Date of Patent: Aug. 8, 2023

(54) PROCESS FOR LOCATION-SPECIFIC SLURRY BASED COATINGS FOR INTERNALLY-COOLED COMPONENT

(71) Applicant: Raytheon Technologies Corporation, Farmington, CT (US)

(72) Inventors: Michael N. Task, Vernon, CT (US); Xuan Liu, Glastonbury, CT (US); Russell A. Beers, Manchester, CT (US); Kevin W. Schlichting, South Glastonbury, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 243 days.

(21) Appl. No.: 17/172,746

(22) Filed: Feb. 10, 2021

(65) Prior Publication Data

US 2021/0164353 A1 Jun. 3, 2021

Related U.S. Application Data

(62) Division of application No. 15/923,432, filed on Mar. 16, 2018, now abandoned.

(51) Int. Cl.
*C23C 16/06* (2006.01)
*F01D 5/28* (2006.01)
(Continued)

(52) U.S. Cl.
CPC ............... *F01D 5/288* (2013.01); *C23C 2/04* (2013.01); *C23C 10/08* (2013.01); *C23C 10/24* (2013.01); *C23C 16/045* (2013.01); *C23C 16/06* (2013.01); *C23C 28/021* (2013.01); *F01D 5/187* (2013.01); *F05D 2220/32* (2013.01);
(Continued)

(58) Field of Classification Search
CPC ......... C23C 16/06; C23C 16/10; C23C 16/12; C23C 16/045
See application file for complete search history.

(56) References Cited

U.S. PATENT DOCUMENTS 6,139,976 A 10/2000 Czech et al.
6,575,817 B2 6/2003 Czech
(Continued)

FOREIGN PATENT DOCUMENTS

CN 111575646 * 8/2020 ............ C23C 10/56
CN 111575646 A * 8/2020 ............ C23C 10/56
(Continued)

OTHER PUBLICATIONS

Perez, F.J., et al., Aluminizing and chromizing bed treatment by CVD in a fluidized bed reactor on austenitic stainless steels:. Surface & Coatings Technology 120-121 (1999) 151-157.*
(Continued)

*Primary Examiner* — Bret P Chen
(74) *Attorney, Agent, or Firm* — Bachman & LaPointe, P.C.

(57) ABSTRACT

A method of coating a component including aluminizing an array of internal passageways within the component; and chromizing a portion of the array of internal passageways within the component. A component, including an airfoil having an array of aluminized internal passageways, the array of aluminized internal passageways chromized up to a demarcation.

8 Claims, 6 Drawing Sheets

(51) Int. Cl.
*C23C 2/04* (2006.01)
*C23C 16/04* (2006.01)
*F01D 5/18* (2006.01)
*C23C 28/02* (2006.01)
*C23C 10/08* (2006.01)
*C23C 10/24* (2006.01)

(52) U.S. Cl.
CPC .... *F05D 2230/90* (2013.01); *F05D 2300/132* (2013.01); *F05D 2300/611* (2013.01)

(56) References Cited

U.S. PATENT DOCUMENTS

| | | | |
|---|---|---|---|
| 6,905,730 B2 | 6/2005 | Ackerman et al. | |
| 7,824,738 B2 | 11/2010 | Smith et al. | |
| 8,545,185 B2 | 10/2013 | Wortman et al. | |
| 9,476,119 B2* | 10/2016 | Atwal | C23C 16/4409 |
| 9,587,302 B2* | 3/2017 | Tang | C23C 10/56 |
| 10,113,225 B2* | 10/2018 | Murphy | C23C 10/32 |
| 10,914,181 B2* | 2/2021 | Stanka | C23C 28/022 |
| 2004/0151834 A1 | 8/2004 | Wustman et al. | |
| 2007/0089675 A1* | 4/2007 | Beck | C23C 14/046 |
| | | | 118/715 |
| 2008/0057189 A1* | 3/2008 | Smith | C23C 10/38 |
| | | | 427/230 |
| 2009/0020216 A1* | 1/2009 | Ruokolainen | B60N 2/686 |
| | | | 156/291 |
| 2009/0263579 A1* | 10/2009 | Karmazin | C23C 14/042 |
| | | | 427/248.1 |
| 2015/0197841 A1* | 7/2015 | Tang | C23C 28/022 |
| | | | 427/252 |
| 2015/0300200 A1 | 10/2015 | Walker | |
| 2016/0017481 A1* | 1/2016 | Livings | C23C 30/00 |
| | | | 428/666 |
| 2016/0108513 A1 | 4/2016 | Task et al. | |
| 2016/0298231 A1* | 10/2016 | Trzcinski | C23C 10/20 |
| 2016/0304993 A1* | 10/2016 | Ravi | F01D 5/288 |
| 2017/0030203 A1 | 2/2017 | Synnott et al. | |
| 2017/0241273 A1 | 8/2017 | Gupta et al. | |
| 2018/0016672 A1 | 1/2018 | Task | |

FOREIGN PATENT DOCUMENTS

| | | | | |
|---|---|---|---|---|
| EP | 2778251 A1 * | 9/2014 | | C23C 10/04 |
| EP | 2975153 A2 | 1/2016 | | |
| EP | 3012343 A1 | 4/2016 | | |
| EP | 3783128 A1 * | 2/2021 | | C23C 10/02 |

OTHER PUBLICATIONS

Smith, A.B., et al., "Vapour aluminide coating of internal cooling channels, in turbine blades and vanes". Surface & Coatings Technology 120-121 (1999) 112-117.*

Goward, G.W., "Progress in coatings for gas turbine airfoils". Surface & Coatings Technology, 108-109 (1998) 73-79.*

Muboyadzhyan, S.A., et al., "Diffusion Aluminide Coatings for Protecting the Surface of the Internal Space of SingleCrystal Turbine Blades Made of Rhenium and Rhenium-Ruthenium-Containing High-Temperature Alloys: Part II". Russian Metallurgy (Metally), vol. 2013, No. 3, pp. 198-205.*

Belan, Juraj, et al., "Microstructural analysis of DV—2 Ni—base superalloy turbine blade after high temperature damage". Procedia Engineering 177 (2017) 482-487.*

Perrut, Mikael, et al., "High temperature materials for aerospace applications: Ni-based superalloys and γ-TiAl alloys". Comptes Rendus Physique 19 (2018) 657-671.*

European Search Report dated Jul. 9, 2019 issued for corresponding European Patent Application No. 19162920.3.

* cited by examiner

PROCESS FOR LOCATION-SPECIFIC SLURRY BASED COATINGS FOR INTERNALLY-COOLED COMPONENT

CROSS-REFERENCE TO RELATED APPLICATION

This application is a divisional of U.S. patent application Ser. No. 15/923,432, filed Mar. 16, 2018.

BACKGROUND

The present disclosure relates to coating and, more particularly, to slurry coating compositions in which the properties of the coating are tailored to resist local conditions within an internally-cooled component.

Gas turbine engines typically include a compressor section to pressurize airflow, a combustor section to burn a hydrocarbon fuel in the presence of the pressurized air, and a turbine section to extract energy from the resultant combustion gases. Gas path components, such as turbine blades, often include airfoil cooling that may be accomplished by external film cooling, internal air impingement and forced convection either separately, or in combination.

The internal cavities include internal passages to direct the passage of the cooling air. As gas turbine temperatures have increased, the geometries of these cooling passages have become progressively more circuitous and complex. Such internal passages are often coated due to deposit-induced hot corrosion as well as high temperature oxidation. Coatings currently in production largely address one of these degradation modes but may be less than effective when used in environments for which they are not optimized.

SUMMARY

A method of coating a component according to one disclosed non-limiting embodiment of the present disclosure includes aluminizing an array of internal passageways within the component, and chromizing a portion of the array of internal passageways within the component after aluminizing the array of internal passageways.

A further aspect of the present disclosure includes chromizing up to a demarcation.

A further aspect of the present disclosure includes that the demarcation is located at 20%-30% of an airfoil span of the component.

A further aspect of the present disclosure includes that the demarcation is at 25% of an airfoil span of the component.

A further aspect of the present disclosure includes that the demarcation is at an airfoil span location where local temperatures exceed approximately 1600 degree F.

A further aspect of the present disclosure includes applying a chromium slurry into the array of internal passageways within the component.

A further aspect of the present disclosure includes that the chromium slurry has a viscosity of 100-200 cp.

A further aspect of the present disclosure includes applying a thermal barrier coat atop a bond coat on an external surface of the component.

A component, according to one disclosed non-limiting embodiment of the present disclosure, includes a substrate having an array of aluminized internal passageways within the component, and a chromium-enriched coating within a portion of the array of internal passageways.

A further aspect of the present disclosure includes a superalloy.

A further aspect of the present disclosure includes that the chromium-enriched coating within the portion of the array of internal passageways is located at an inboard section of the component.

A further aspect of the present disclosure includes that the chromium-enriched coating within the portion of the array of internal passageways is located up to a demarcation that is located at 20%-30% of an airfoil span of the component.

A further aspect of the present disclosure includes that the chromium-enriched coating within the portion of the array of internal passageways is located up to a demarcation that is located at 25% of an airfoil span of the component.

A further aspect of the present disclosure includes that the chromium-enriched coating within the portion of the array of internal passageways is located up to an airfoil span location where local temperatures exceed approximately 1600 degree F.

A further aspect of the present disclosure includes that the chromium-enriched coating is 10-50 microns thick.

A component according to one disclosed non-limiting embodiment of the present disclosure includes an airfoil having an array of aluminized internal passageways, the array of aluminized internal passageways chromized up to a demarcation.

A further aspect of the present disclosure includes that the demarcation is located at 20%-30% of a span of the airfoil.

A further aspect of the present disclosure includes that the demarcation is located at 25% of a span of the airfoil.

A further aspect of the present disclosure includes that the demarcation is located is at an airfoil span location where local temperatures exceed approximately 1600 degree F.

A further aspect of the present disclosure includes that the component is a turbine blade.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
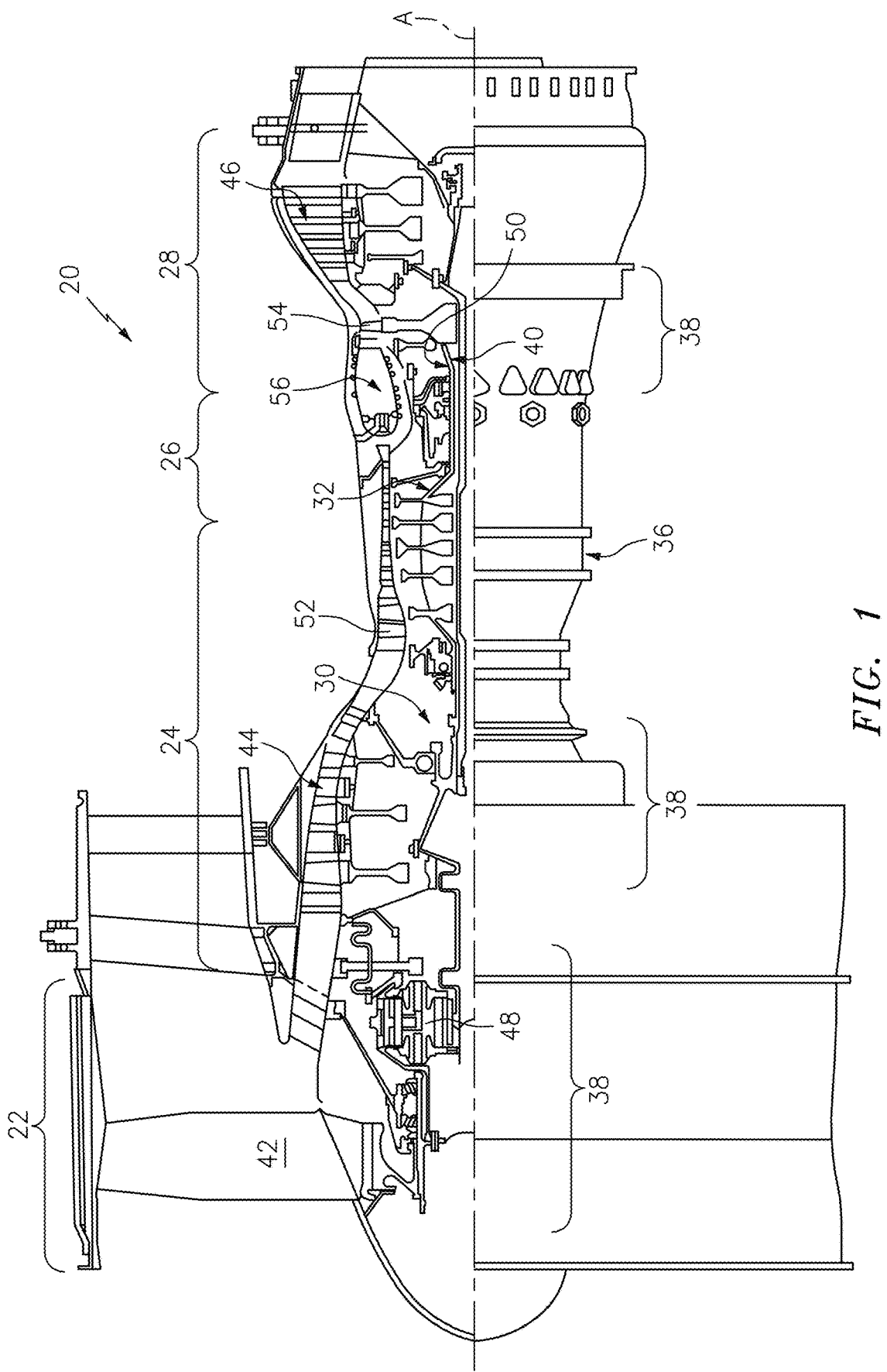
FIG. 1 is a schematic cross-section of an example gas turbine engine architecture.

FIG. 1 schematically illustrates a gas turbine engine 20. The exemplary gas turbine engine 20 is disclosed herein as a two-spool turbo fan that generally incorporates a fan section 22, a compressor section 24, a combustor section 26 and a turbine section 28. The fan section 22 drives air along a bypass flowpath and along a core flowpath for compression by the compressor section 24, communication into the combustor section 26, then expansion through the turbine section 28. Although depicted as a turbofan in the disclosed non-limiting embodiment, it should be understood that the concepts described herein are not limited to use with turbofans as the teachings may be applied to other types of turbine engine architectures such as low bypass turbofans, turbojets, turboshafts, three-spool (plus fan) turbofans and other non-gas turbine components.

The engine 20 generally includes a low spool 30 and a high spool 32 mounted for rotation an engine central longitudinal axis "A". The low spool 30 generally includes an inner shaft 40 that interconnects a fan 42, a low pressure compressor ("LPC") 44 and a low pressure turbine ("LPT") 46. The inner shaft 40 drives the fan 42 directly, or through a geared architecture 48 at a lower speed than the low spool 30. An exemplary reduction transmission is an epicyclic transmission, namely a planetary or star gear system.

The high spool 32 includes an outer shaft 50 that interconnects a high pressure compressor ("HPC") 52 and high pressure turbine ("HPT") 54. A combustor 56 is arranged between the high pressure compressor 52 and the high pressure turbine 54. The inner shaft 40 and the outer shaft 50 are concentric and rotate the engine central longitudinal axis "A", which is collinear with their longitudinal axes.

Core airflow is compressed by the LPC 44, then the HPC 52, mixed with the fuel and burned in the combustor 56, then expanded over the HPT 54, then the LPT 46. The turbines 54, 46 rotationally drive the respective high spool 32 and low spool 30 in response to the expansion. The main engine shafts 40, 50 are supported at a plurality of points by bearing structures 38 within the static structure 36.

Figure 2:
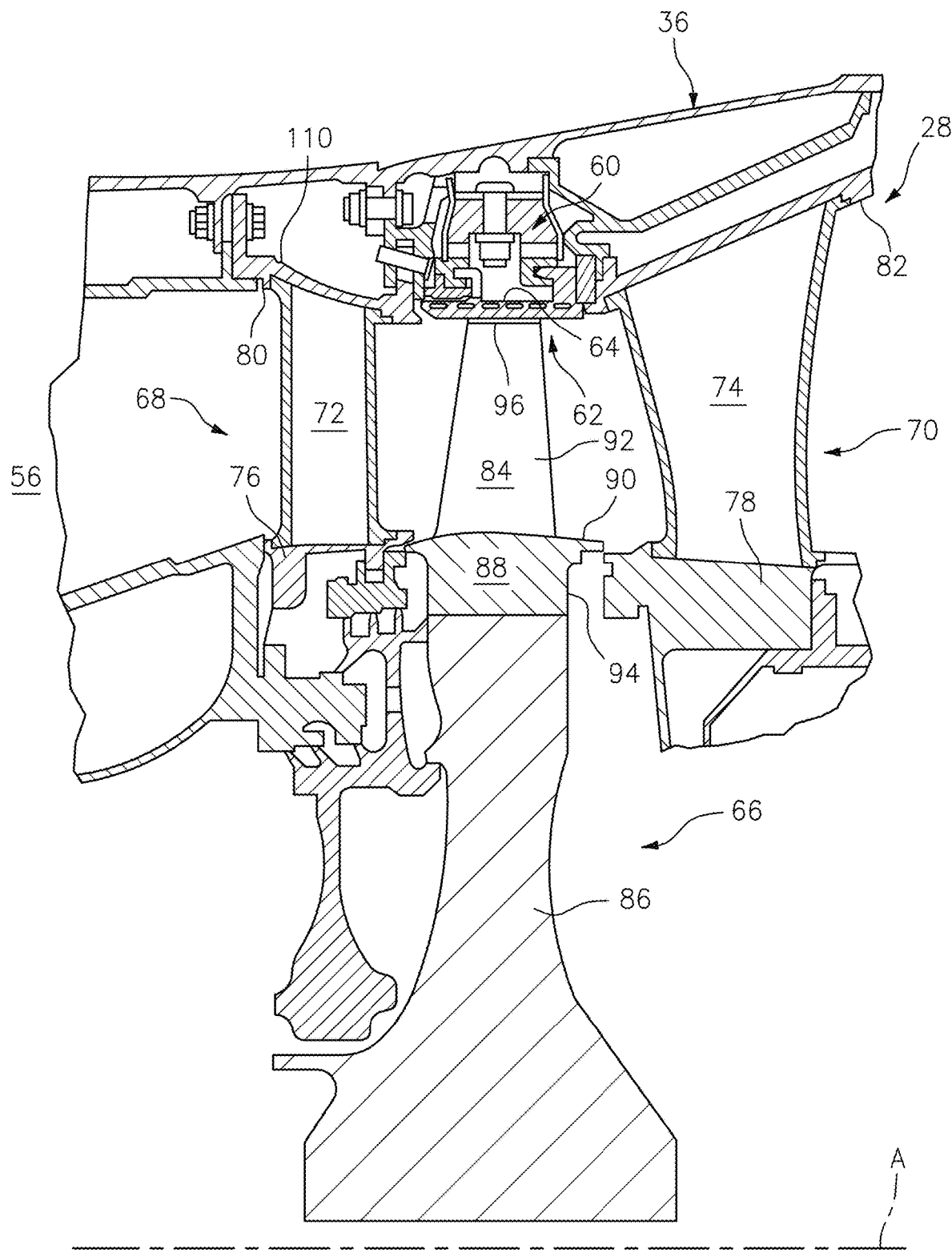
FIG. 2 is an enlarged schematic cross-section of an engine turbine section.

With reference to FIG. 2, an enlarged schematic view of a portion of the turbine section 28 is shown by way of example; however, other engine sections will also benefit herefrom. A shroud assembly 60 within the engine case structure 36 supports a blade outer air seal (BOAS) assembly 62 with a multiple of circumferentially distributed BOAS 64 proximate to a rotor assembly 66 (one schematically shown).

The shroud assembly 60 and the BOAS assembly 62 are axially disposed between a forward stationary vane ring 68 and an aft stationary vane ring 70. Each vane ring 68, 70 includes an array of vanes 72, 74 that extend between a respective inner vane platform 76, 78 and an outer vane platform 80, 82. The outer vane platforms 80, 82 are attached to the engine case structure 36.

The rotor assembly 66 includes an array of blades 84 circumferentially disposed around a disk 86. Each blade 84 includes a root 88, a platform 90 and an airfoil 92 (also shown in FIG. 3). The blade roots 88 are received within a rim 94 of the disk 86 and the airfoils 92 extend radially outward such that a tip 96 of each airfoil 92 is closest to the blade outer air seal (BOAS) assembly 62. The platform 90 separates a gas path side inclusive of the airfoil 92 and a non-gas path side inclusive of the root 88.

Figure 3:
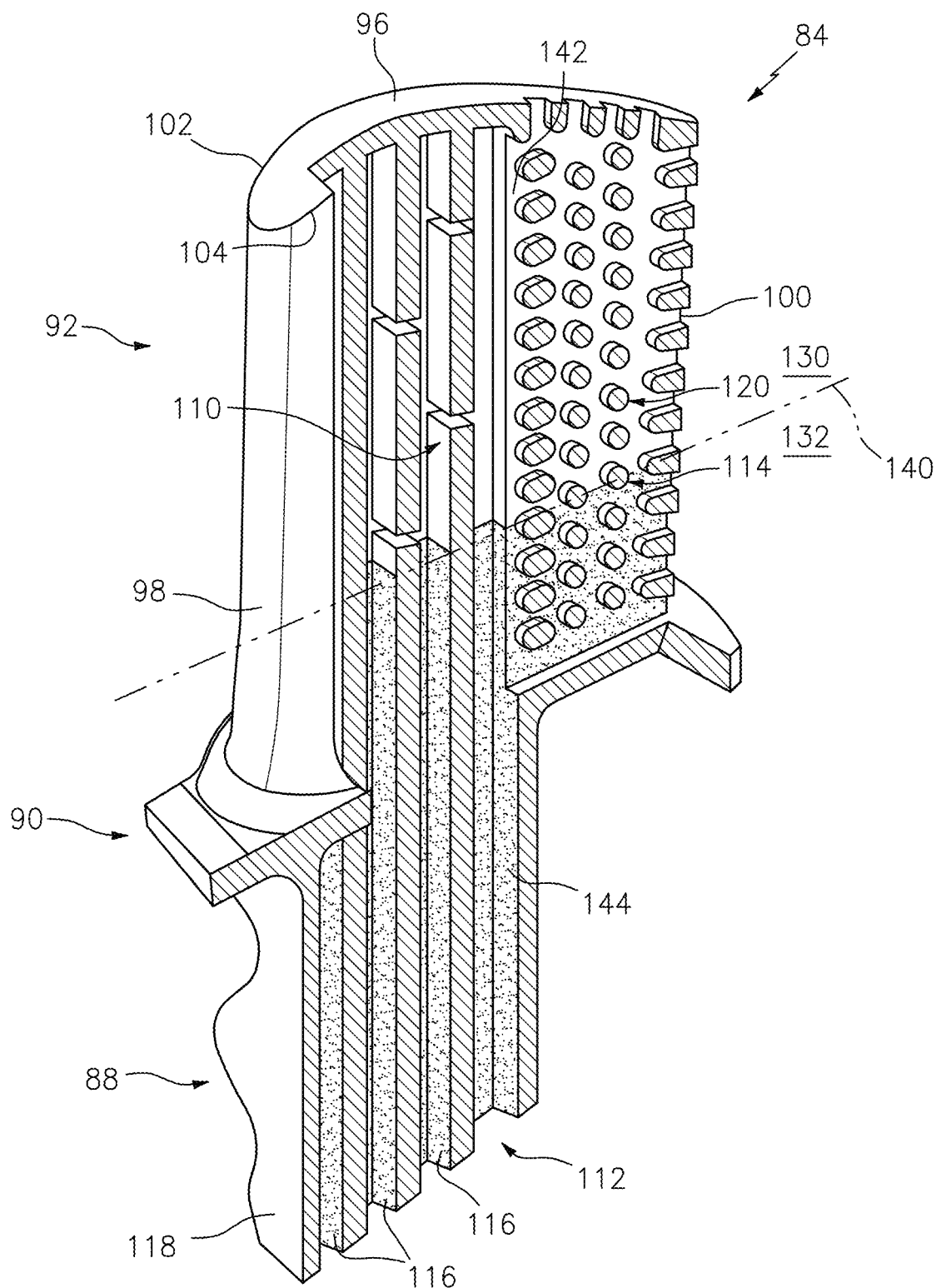
FIG. 3 is a perspective view of an airfoil as an example component for use with a coating method showing an example internal architecture.

With reference to FIG. 3, the platform 90 generally separates the root 88 and the airfoil 92 to define an inner boundary of a gas path. The airfoil 92 defines a blade chord between a leading edge 98, which may include various forward and/or aft sweep configurations, and a trailing edge 100. A first sidewall 102 that may be convex to define a suction side, and a second sidewall 104 that may be concave to define a pressure side are joined at the leading edge 98 and at the axially spaced trailing edge 100. The tip 96 extends between the sidewalls 102, 104 opposite the platform 90. It should be appreciated that the tip 96 may include a recessed portion.

To resist the high temperature stress environment in the gas path of a turbine engine, each blade 84 may be formed by casting. It should be appreciated that although a blade 84 with an array of internal passageways 110 (shown schematically) will be described and illustrated in detail, other hot section components including, but not limited to, vanes, turbine shrouds, end walls and other components will also benefit from the teachings herein.

The external airfoil surface may be protected by a protective coating that overlies and contacts the external airfoil surface. Such coatings may be of the MCrAIX type. The terminology "MCrAIX" is a shorthand term of art for a variety of families of overlay protective layers that may be employed as environmental coatings or bond coats in thermal barrier coating systems. In this, and other forms, M refers to nickel, cobalt, iron, and combinations thereof. In some of these protective coatings, the chromium may be omitted. The X denotes elements such as hafnium, zirconium, yttrium, tantalum, rhenium, ruthenium, palladium, platinum, silicon, titanium, boron, carbon, and combinations thereof. Specific compositions are known in the art. Optionally, a ceramic layer overlies and contacts the protective layer. The ceramic layer is preferably yttria-stabilized zirconia, which is a zirconium oxide. Other operable ceramic materials may be used as well. Often, when there is no ceramic layer present, the protective layer is termed an "environmental coating." When there is a ceramic layer present, the protective layer is often referred to as a "bond coat".

The array of internal passageways 110 generally includes one or more feed passages 112 that communicate airflow into a trailing edge cavity 114 within the blade 84. It should be appreciated that the array of internal passageways 110 may be of various geometries, numbers and configurations and the feed passage 112 in this embodiment is the aft most passage that communicates cooling air to the trailing edge cavity 114. The feed passage 112 generally receives cooling flow through at least one inlet 116 within a base 118 of the root 88.

The trailing edge cavity 114 may include a multiple of trailing edge cavity features 120 that result in a circuitous and complex cooling airflow path. It should be appreciated that although particular features are delineated within certain general areas, the features may be otherwise arranged or intermingled and still not depart from the disclosure herein.

The array of internal passageways 110 are generally present in various gas turbine components, such as the example blade 84, to allow for the passage of cooling air. As gas turbine temperatures have increased, the geometries of these cooling passages have become progressively more circuitous and complex. These internal passages 110, as well as other portions of the workpiece, are often coated with a metallic coating applied via a diffusion chromizing process to prevent hot corrosion. Generally, components are placed in a retort for distillation, Cr-containing vapor species are generated and supplied to the surface of the components via gas phase transport, and a Cr-rich coating is formed. Although effective, the vapor phase chromizing process may suffer from an inability to achieve sufficient coverage and Cr content on some components, particular High Pressure Turbine (HPT) blades that are either very large or that contain very complex internal passages.

The example component workpiece, such as the blade 84, is typically manufactured of a nickel-base alloy, and more preferably of a nickel-base superalloy. A nickel-base alloy has more nickel than any other element, and a nickel-base superalloy is a nickel-base alloy that is strengthened by the precipitation of gamma prime or a related phase. The component, and thence a substrate and the internal passageways thereof, are thus of nickel-base alloy, and more preferably are a nickel-base superalloy.

In this embodiment, the array of internal passageways 110 within the blade 84 or other workpiece includes an aluminized section 130 and a chromized section 132. That is, the entirety of the previously-aluminized array of internal passageways 110 are chromized only up to a demarcation 140 such that only the chromized section 132 has a relatively thick (e.g., 1.5-3 mil) Cr-rich coating 144. In this embodiment, the demarcation 140 may be located at 20%-30% the span of the airfoil 92 and more specifically at a 25% span location of the airfoil 92. That is, the previously-aluminized array of internal passageways 110 is chromized up to the demarcation 140. Aluminides are protective in high temperature oxidation and less so in hot corrosion, while the reverse is true for chromizing.

Alternatively, the demarcation 140 may be defined by a temperature range experienced by the airfoil 92 during operation. For example, the demarcation 140 may be defined at the location on the airfoil 92 where local temperatures exceed approximately 1600 degree F. Typically, high temperature oxidation occurs around 1700 F-1800 F which appears in the outboard section of the airfoil 92 such that the aluminides in the aluminized section 130 forms an aluminum oxide scale this is resistant to oxidation damage at high temperatures while the relatively cooler chromized section 132 is resistant to contaminates at relatively cooler inboard sections. That is, the aluminized section 130 and the chromized section 132 provide effective resistance to oxidation and deposit-induced hot corrosion, respectively when flown in polluted environments.

Figure 4:
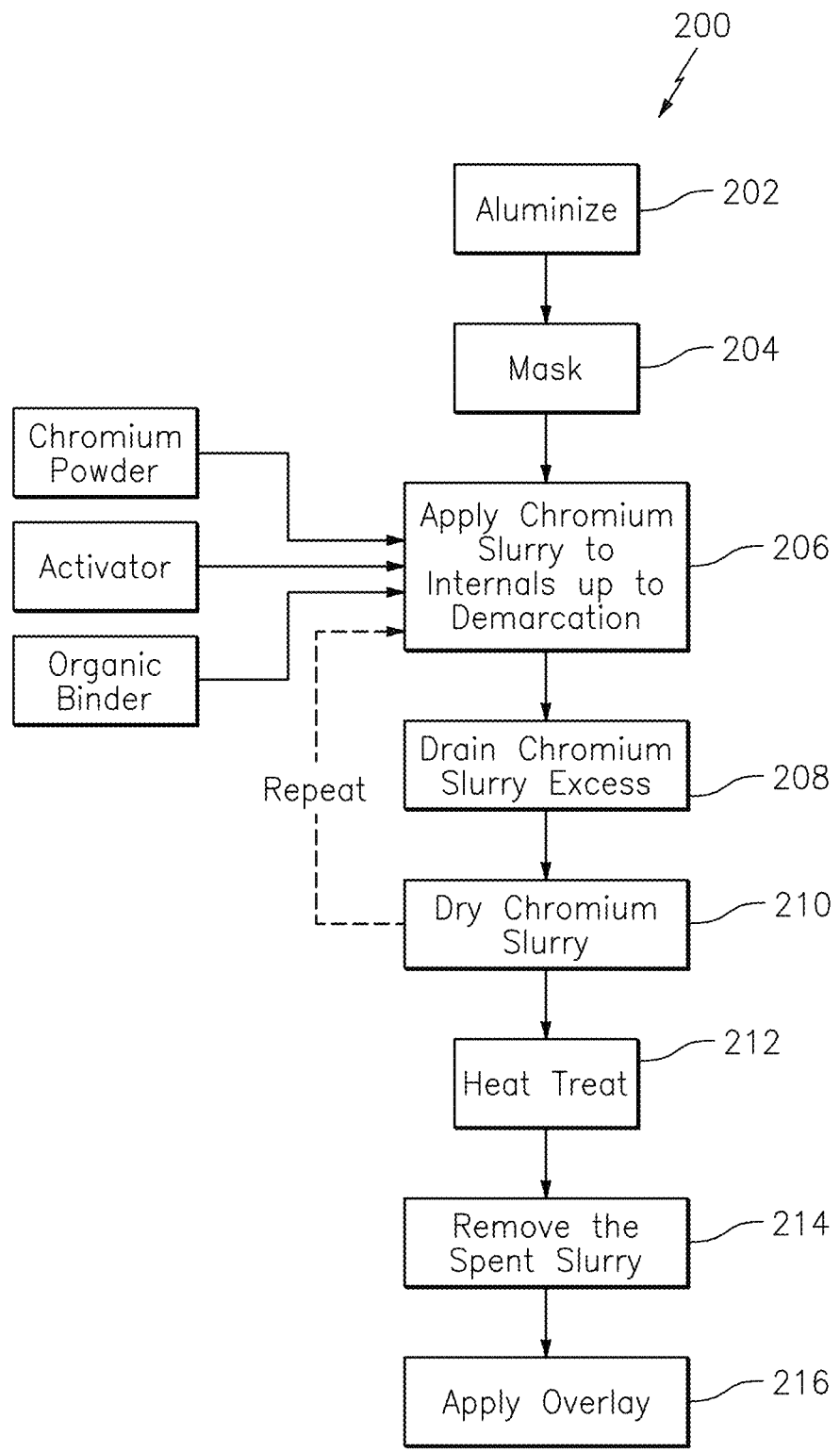
FIG. 4 is a block diagram representing a method of coating an array of internal passageways of a component.

With reference to FIG. 4, one disclosed non-limiting embodiment of a method 200 for applying a location-specific coating is illustrated. The steps or actions described with respect to the method 200, can be employed with additional steps or other processes as desired. Although a turbine blade 84 is illustrated as the article in the disclosed embodiment, the article may be a metallic article formed of a base alloy substrate. For example, the base alloy substrate is a superalloy. In a further example, the superalloy is a nickel-base alloy. In a still further example, the base alloy is a low-chromium superalloy, such as a superalloy having less than approximately 12% by weight chromium. It should be appreciated that although the blade 84 is illustrated in the disclose embodiment, any such component desired to have internal hot corrosion protection and high temperature oxidation resistance will benefit herefrom.

Figure 5:
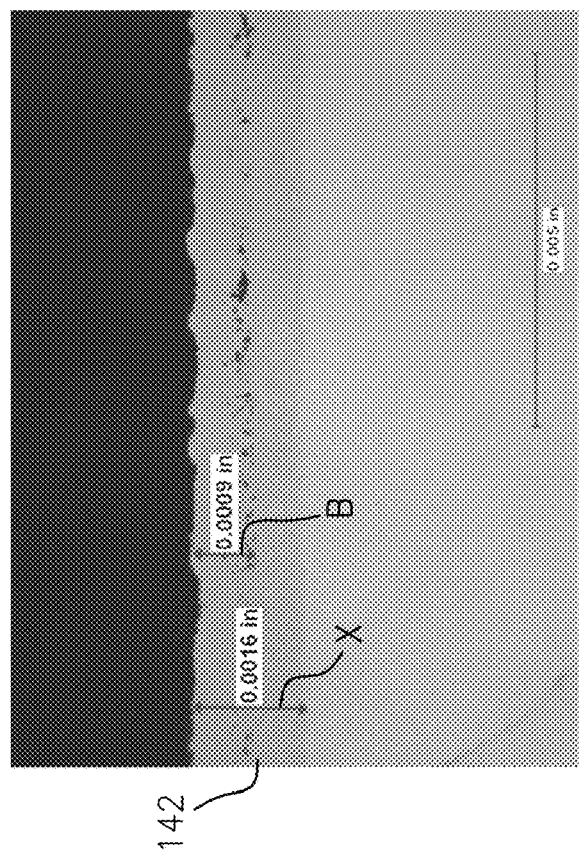
FIG. 5 is a micrograph of an aluminide coating before any chromizing within a portion of an array of internal passageways prior to chromizing.

Initially, the first step of the process 200 is to aluminize (step 202; FIG. 5) the component internals, e.g., the array of internal passageways 110. The aluminizing may be accomplished by chemical vapor deposition (CVD), above the pack, or slurry processes. The aluminizing alone will be the mitigation strategy in the outer portions outboard of the demarcation 140 where high temperature oxidation damage typically dominates. In addition, the externals may be aluminized as well.

The component may be exposed to an aluminum source material such as a chromium-aluminum alloy in the presence of an activator, such as a halide activator, and a cover gas such as argon or hydrogen, at a temperature of between approximately 1900 F-2100 F (1037 C-1148 C) for a time of between 1-6 hours. The halide activator can be, for instance, a fluoride or a chloride in a solid or gaseous form.

In another example aluminizing process, the aluminum or aluminum source and activator can be combined with another material such as aluminum oxide powder prior to being deposited on the component. The other material can enhance the deposition of aluminum or the properties of the deposited aluminum. Then, the component is exposed to the aluminum or aluminum mixture at a temperature of less than approximately 1500 F (815 C) for a time of between approximately 2-4 hours.

In another example aluminizing process, the aluminum or aluminum source and activator can be combined with another material such as aluminum oxide powder prior to being deposited on component to enhance the deposition of aluminum or the properties of the deposited aluminum. Then, the component is exposed to the aluminum or aluminum mixture at a temperature of between 1500 F-1900 F (815 C-1037 C) for a time of between 2-8 hours. In another example process, the aluminum or aluminum source and activator can be combined with another material such as aluminum oxide powder and a binder to form a slurry prior to being deposited on component. The other material can enhance the deposition of aluminum or the properties of the deposited aluminum. Then, the component is exposed to the aluminum or aluminum mixture at a temperature of between 1500 F-1900 F (815 C-1037 C) for a time between 2-8 hours.

Any of the aluminizing processes described above can be repeated to incorporate additional aluminum multiple times. Additionally, any of the processes described above can form an aluminum coating that is between approximately 0.5 and 3.0 thousandth of an inch (0.01 to 0.08 mm) thick, for example.

After aluminizing to provide an aluminized coating 142 in the array of internal passageways 110, the component may be masked (step 204). The mask may be performed via plugging/blocking of the openings to the array of internal passageways 110. Other particular external areas such as the root, underplatform, and airfoil external surfaces may also be masked by sacrificial coating, taping, mechanical fixturing/masking or the like.

Figure 6:
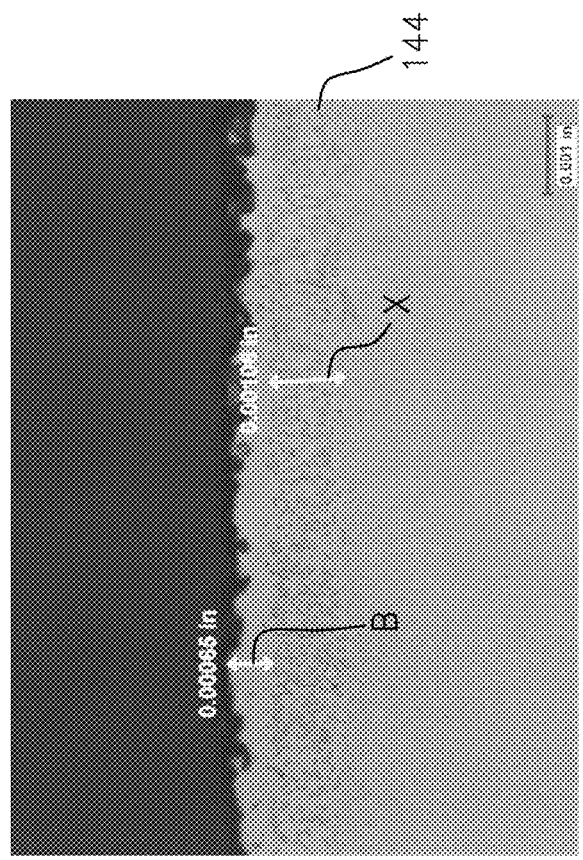
FIG. 6 is a micrograph of a portion of the array of internal passageways in which the aluminide coating that has been chromized.

Next, the component is chromized (step 206; FIG. 6) up to the demarcation 140. For example, only an inboard portion, e.g., from the root 88, platform 90, and the airfoil 92, of the component is dipped into a tank containing a chromizing slurry so that the slurry is applied to the internal surfaces up to the desired demarcation 140 of the airfoil 92. The chromium slurry, for example, can be flowed through the component to achieve coverage on complex geometries, here, the array of internal passageways 110. The chromium slurry may alternatively be applied to the component, for example, by pouring, injecting, or otherwise flowing the slurry into the array of internal passageways 110. In another disclosed non-limiting embodiment, a portion of the component is dipped therein. Alternately, the chromium slurry is applied via other carriers, devices, and/or methods. The resultant chromium enriched diffusion coating 144 (FIG. 6;

the aluminide after being chromized) in terms of microstructure and thickness is similar to the aluminide coating 142 (FIG. 5; before any chromizing) but a substantial amount of the aluminum in the coating is replaced with chromium. The vapor aluminide shown in FIG. 5 may be deposited by a high temperature, low activity aluminizing process. An outer layer (dimension B) which may be about 0.9 mil, is the beta-NiAl phase, which grows outward from the original alloy surface; the remainder of the coating is the interdiffusion zone (IDZ). The entire chromium enriched diffusion coating 144 (FIG. 6; dimension B+X) in one example is about 1.6 mil. The outer layer of the coating (dimension B; FIG. 6) was formerly beta-NiAl that was converted to either Cr-rich gamma-Ni solid solution or gamma+alpha-Cr upon chromizing.

The chromium slurry may include a mixture of chromium powder, chromium Chloride (CrCl3) particles as an activator, and, optionally, an organic binder. While using a slurry with no oxide filler is an option, other embodiments may utilize either Al2O3 or SiO2 in this process. SiO2 has the benefit of being removable via autoclave with a basic solution of KOH or NaOH, which may be desirable for the array of internal passageways 110. Other slurry coatings contain aluminum oxide filler, but the presence of such a filler in a coating slurry that is used to coat internal surfaces such as the array of internal passageways 110 may be a primary cause of undesirable obstruction and/or flow disturbances within the array of internal passageways 110. The chromium (Cr) slurry, in one example in terms of weight percentages, includes 48.5-68% by weight chromium powder, 0.9-3.4% by weight chromium Chloride (CrCl3) particles, and 30-50% by weight organic binder. The resultant chromium (Cr) slurry forms a low-viscosity fluid capable of being flowed through internal passages. In one example, the slurry has a viscosity of 100-200 cp. Any operable organic binder may be used. Examples include, but are not limited to, B4 (n-propyl bromide-based organic binder such as that from Akron Paint and Varnish) and Klucel H (hydroxypropyl cellulose), and mixtures thereof. Other organic binders such as a water based organic binder may alternatively be utilized.

The chromium (Cr) slurry, in another example without an organic binder in terms of weight percentages, includes 97% by weight chromium powder and 0.03% by weight chromium Chloride (CrCl3) particles.

Next, the excess chromium slurry is drained away (step 208). Simply allowing the relatively viscous chromium slurry to flow out of the internal passageways 110 may perform such draining.

The chromium slurry is then dried to drive off the organic binder (step 210). The drying evaporates the flowable carrier component of the organic binder (e.g., flowable organic solvents and water) of the chromium slurry, leaving the organic binder that binds the particles together. Driving off the organic binder is performed at a relatively low temperature for short periods of time. In one example, drying of the binder is performed at 200 F (93 C) for 1 hour. Alternatively, the drying could be performed at room temperature given a commensurate greater time period. The applying, draining and drying steps may also be repeated multiple times to achieve a desired thickness and/or coverage.

Next, the component is heat treated (step 212). In one example, heat treat may be accomplished at a temperature of from 1600 F (871 C) to 2100 F (1149 C) most preferably from 1925 F (1052 C) to 2000 F (1093 C), for a time of 4-8 hours, preferably, 5-6 hours. The heat treating may be performed in an inert (e.g., argon) or reducing (e.g., hydrogen) atmosphere. In the case of the inert atmosphere, the atmosphere is largely free of oxygen and oxygen-containing species such as water vapor.

The heat treat allows, through a mechanism involving the reaction of the Cr powder with the activator, gas phase transport of Cr-containing species to the component surface, and subsequent diffusion of Cr into the parent material, the formation of a coating that, in one disclosed non-limiting embodiment, is 10-50 microns thick chromium-enriched single phase y face centered cubic Ni-based solid solution layer that prevents hot corrosion. There may be some transition zone to which the Cr-rich vapors travel, but the outboard portion of the blade will remain aluminized with minimum Cr deposition. If the aluminizing is accomplished via a slurry process, the possibility exists to only conduct one heat treatment.

After the heat treatment the "spent" slurry is removed (step 214). There is essentially a friable crust of Cr-containing powder on the array of internal passageways 110 after the heat treatment, and this is to be removed. In one example, warm hydrogen chloride (HCl) may be utilized to dissolve away this material. Alternatively, or in addition thereto, physical methods, e.g., an autoclave, high pressure flushing with water, or others may be utilized to remove the crust of Cr-containing powder.

Next, an overlay coating may be applied to gas path surfaces of the blade 84 such as the airfoil 92 and the upper surfaces of the platform 90 (step 216). The portions of the exterior may be along essentially the entire exterior or a portion of the exterior surface and gaspath-facing surface(s) of the platform, the shroud, etc. The overlay coating as defined herein includes, but is not limited to, cathodic Arc metallic bondcoat, and external duplex electron beam-physical vapor deposition (EB-PVD) ceramic coatings.

Figure 7:
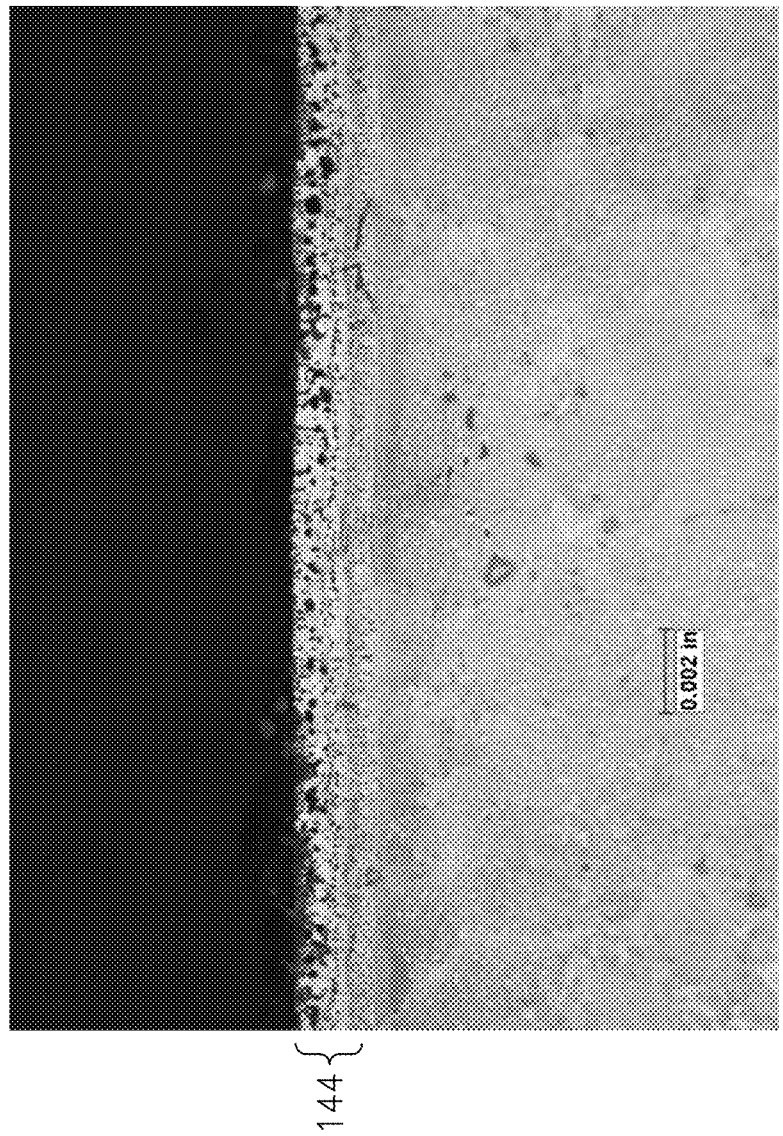
FIG. 7 is a micrograph of a component processed with the method of coating the array of internal passageways after 1000 hours in a hot corrosion test at 1350 F.

Detailed investigation of fielded components has shown that hot corrosion damage commonly occurs on the internal surfaces in cooler locations, such as towards the base of the airfoil and below the platform, while the airfoil internals are commonly challenged in high temperature oxidation further outboard towards the tip. By using this location-specific coating process, both degradation modes can be addressed individually. Hot corrosion testing of the coating deposited in the relatively cooler locations of the airfoil internals shows no coating penetration after 1000 hours of hot corrosion exposure at 1350 F in a corrosive sulfate mixture (FIG. 7).

The use of the terms "a", "an", "the", and similar references in the context of description (especially in the context of the following claims) are to be construed to cover both the singular and the plural, unless otherwise indicated herein or specifically contradicted by context. The modifier " " used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward", "aft", "upper", "lower", "above", "below" and the like are with reference to normal operational attitude and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason, the appended claims should be studied to determine true scope and content.

What is claimed is:

1. A method of coating a turbine blade having an array of internal passageways that extend from a root to an airfoil, the method comprising:
   aluminizing the array of internal passageways within the turbine blade; and
   chromizing a portion of the array of internal passageways after aluminizing the array of internal passageways only up to a demarcation located at 20%-30% of an airfoil span of the turbine blade from the root such that an outer layer inboard of the demarcation of the array of internal passageways is converted to either Cr-rich gamma-Ni solid solution or gamma+alpha-Cr upon chromizing such that an aluminized section outboard of the demarcation and a chromized section inboard of the demarcation are about equal in thickness.

2. The method as recited in claim 1, wherein the demarcation is at an airfoil span location where local temperatures exceed approximately 1600 degree F.

3. The method as recited in claim 1, wherein chromizing the portion of the array of internal passageways comprises applying a chromium slurry into the array of internal passageways.

4. The method as recited in claim 3, wherein the chromium slurry has a viscosity of 100-200 cp.

5. The method as recited in claim 1, further comprising applying a bond coat on an external surface of the turbine blade, and applying a thermal barrier coat on top of the bond coat.

6. The method as recited in claim 1, further comprising applying an overlay coating onto exterior surfaces of the airfoil and an upper surface of a platform between the root and the airfoil.

7. The method as recited in claim 1, wherein the outer layer that forms a chromium-enriched diffusion coating in the chromized section is between approximately 0.00039-0.0019 inches thick and comprises a chromium-enriched single phase y face centered cubic Ni-based solid solution layer, the aluminized section outboard of the demarcation forming an aluminum oxide scale resistant to oxidation damage above 1600 F during gas turbine engine operations while the chromium-enriched diffusion coating inboard of the demarcation is resistant to contaminants at temperatures less than 1600 F during gas turbine engine operations.

8. The method as recited in claim 1, wherein the aluminizing step produces a beta-NiAl phase in the outer layer, and wherein the chromizing step converts the beta-NiAl phase to either the Cr-rich gamma-Ni solid solution or the gamma+alpha-Cr.

* * * * *